United States Patent
Pascal et al.

(10) Patent No.: US 9,000,961 B2
(45) Date of Patent: Apr. 7, 2015

(54) ARRANGEMENT FOR READING OUT AN ANALOGUE VOLTAGE SIGNAL WITH SELF-CALIBRATION

(71) Applicant: ABB Technology AG, Zürich (CH)

(72) Inventors: Joris Pascal, Baden (CH); Stéphane Isler, Nommay (FR)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 14/085,276

(22) Filed: Nov. 20, 2013

(65) Prior Publication Data
US 2014/0077980 A1    Mar. 20, 2014

Related U.S. Application Data

(63) Continuation of application No. PCT/EP2011/058291, filed on May 20, 2011.

(51) Int. Cl.
| | |
|---|---|
| *H03M 3/02* | (2006.01) |
| *H03M 1/10* | (2006.01) |
| *H03M 1/06* | (2006.01) |
| *H03M 3/00* | (2006.01) |

(52) U.S. Cl.
CPC .......... *H03M 1/0609* (2013.01); *H03M 1/1004* (2013.01); *H03M 3/382* (2013.01); *H03M 3/43* (2013.01)

(58) Field of Classification Search
None
See application file for complete search history.

(56) References Cited

U.S. PATENT DOCUMENTS

| | | | | |
|---|---|---|---|---|
| 6,449,569 | B1 * | 9/2002 | Melanson | 702/65 |
| 7,196,645 | B2 * | 3/2007 | Bock | 341/120 |
| 7,693,672 | B2 * | 4/2010 | Batruni | 702/86 |
| 2009/0315537 | A1 | 12/2009 | Kidd | |

FOREIGN PATENT DOCUMENTS

WO    WO 2012/143019 A1    10/2012

OTHER PUBLICATIONS

International Search Report (PCT/ISA/210) mailed on Jan. 23, 2012, by the European Patent Office as the International Searching Authority for International Application No. PCT/EP2011/058291.
Witte et al., "Hardware complexity of a correlation based background DAC error estimation technique for sigma-delta ACDs", IEEE International Symposium on Circuits and Systems, May 2010, pp. 2167-2170.

* cited by examiner

*Primary Examiner* — Howard Williams
(74) *Attorney, Agent, or Firm* — Buchanan Ingersoll & Rooney PC

(57) ABSTRACT

An arrangement for reading out an analog voltage input signal includes an input applying the input signal thereto, and a reference unit generating an analog reference voltage. To perform online self-calibration, the arrangement includes a superposition unit generating a combined analog signal by superimposing the analog reference voltage onto the input signal, a converting unit converting the combined analog signal into a one-bit serial data stream at a conversion sampling rate, and a decomposition unit, which includes at least two digital filters configured to generate from the serial data stream two corresponding digital signals at different data rates, which can be less than the conversion sampling rate. Two data processing units calculate from the corresponding digital signal a digital input voltage representing the input signal and a digital reference voltage representing the analog reference voltage or a disturbance voltage signal representing parasitic voltage components introduced by the superposition unit, respectively.

15 Claims, 6 Drawing Sheets

ARRANGEMENT FOR READING OUT AN ANALOGUE VOLTAGE SIGNAL WITH SELF-CALIBRATION

RELATED APPLICATION

This application claims priority as a continuation application under 35 U.S.C. §120 to PCT/EP2011/058291, which was filed as an International Application on May 20, 2011 designating the U.S. The entire content of this application is hereby incorporated by reference in its entirety.

FIELD

The present disclosure relates to an arrangement for reading out an analog voltage input signal with self-calibration.

BACKGROUND INFORMATION

In an arrangement known under the term readout electronics or front end electronics, the analog voltage input signal is applied to an analog to digital converter (ADC). Such readout electronics are used to generate a digital voltage signal from the input signal which can then be further processed digitally. Known devices with readout electronics can be, for example, multimeters, instrument transformers or sensor interfaces.

In order to be able to guarantee a highly reliable digital signal, readout electronics can be required to exhibit high initial accuracy, as well as high temperature and ageing stability. In addition, the high accuracy needs to be ensured over the whole specified temperature range and over a predefined time period, where the predefined time period is usually the time between a manual calibration of the readout electronics and the next calibration. During manual calibration, the manufacturer of the readout electronics applies an external standard reference voltage to the voltage signal input of the arrangement and uses the resulting digital signal to estimate and correct the gain error of the arrangement. The time period between two manual calibrations as well as the operating temperature range can be extendable by enabling the arrangement for so-called self-calibration. This is, for example, known under the term auto-calibration from the 3458A Multimeter by Agilent Technologies, as is described in the corresponding Calibration Manual, Manual Part Number 03458-90017. For the auto-calibration, the 3458A is equipped with internal reference standards, and the estimation and correction of gain errors is performed automatically whenever the auto-calibration function is invoked. During auto-calibration, the multimeter cannot be used for measurement purposes.

U.S. 2009/0315537 A1 discloses a sampling module for sampling an analog characteristic of a power transmission system. The sampling module includes a scaling circuit that reduces the magnitude of the analog characteristic, and an ADC which produces a 1-bit serial digital data stream from the reduced analog characteristic. The 1-bit serial digital data stream is digitally filtered by a digital filter and then resampled by a resampling module, where the sample rate of the resampling module is chosen in dependence on the further processing requirements of the particular analog characteristic. It is suggested that the scaling circuit could be calibrated, without giving any details for how the calibration could be implemented. Handling of signal errors which were introduced by the ADC can be not mentioned.

FIG. 1 shows a schematic diagram of known readout electronics with a self-calibration circuit to correct the gain error of the readout electronics. The gain of the readout electronics is summarized by the series connection of a gain block $G_A$ and converting means ADC having a gain $G_B$. The input signal to the readout electronics is, under normal working conditions, an analog voltage input signal $V_{in}$, which is transformed into a corresponding digital output signal 2. For self-calibration purposes, internal reference means ref generate an analog reference voltage $V_{ref}$, which is applied to an input switch 3 as well as to the converting means ADC. When self-calibration is desired, the input switch 3 needs to be operated in order to switch over from the analog voltage input signal $V_{in}$ to the reference voltage $V_{ref}$. The digital output signal 2 of the converting means ADC is then expected to be equal to the overall gain of the readout electronics $G_A \cdot G_B$, since the digital output signal 2 equals the digitized value of the analog input signal 1 divided by the digitized value of the reference voltage $V_{ref}$ i.e. it equals $G_A \cdot G_B \cdot V_{ref}/V_{ref}$. A discrepancy between the digital output signal 2 and the expected value $G_A \cdot G_B$ indicates the gain error of the readout electronics, the value of which is stored. Switch 3 is then operated back to apply the analog voltage input signal $V_{in}$, and the gain error is used to correct the digital output signal 2 generated from the analog voltage input signal $V_{in}$.

In the field of power transmission and distribution, voltages and currents can be measured by sensors for which it is desirable to perform self-calibration of the corresponding readout electronics without interrupting the current path of the analog voltage input signal $V_{in}$, so that the availability of the readout electronics is increased and manual interaction with the sensors is reduced. This type of self-calibration can also be called online self-calibration. In PCT/EP2011/001941, an arrangement is described for reading out an analog voltage input signal which at the same time delivers a signal which can be used to calibrate the arrangement without needing to disconnect the input signal. The main part of this arrangement can be superposition means which can be configured to generate a combined analog signal by superimposing the reference voltage onto the analog voltage input signal. Since the combined analog signal contains both the information of the input signal and the reference voltage, it is suitable to be used for self-calibration purposes while at the same time delivering the input signal to the ADC.

SUMMARY

An exemplary embodiment of the present disclosure provides an arrangement for reading out an analog voltage input signal. The exemplary arrangement includes a voltage signal input for applying the analog voltage input signal thereto, and reference means for generating an analog reference voltage. The exemplary arrangement also includes superposition means for generating a combined analog signal by superimposing the analog reference voltage onto the analog voltage input signal, and converting means for converting the combined analog signal into a one-bit serial data stream at a conversion sampling rate. In addition, the exemplary apparatus includes decomposition means, which include a first digital filter configured to generate from the one-bit serial data stream a first digital signal at a first data rate, which is less than the conversion sampling rate, and first data processing means for calculating from the first digital signal a digital input voltage representing the analog voltage input signal. The decomposition means also include a further digital filter configured to generate from the one-bit serial data stream a further digital signal at a further data rate, which is less than the conversion sampling rate and different from the first data rate, and further data processing means for calculating from the further digital signal one of a digital reference voltage representing the analog reference voltage and a disturbance voltage signal representing parasitic voltage components introduced by the superposition means.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
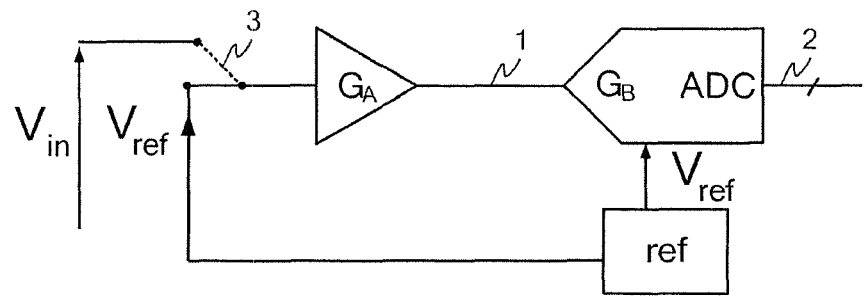
FIG. 1 is a schematic diagram of a known readout electronics circuit with self-calibration.

Exemplary embodiments of the present disclosure provide an arrangement for reading out an analog voltage input signal, which includes a voltage signal input for applying the analogue voltage input signal thereto, reference means for generating an analog reference voltage, and means to perform online self-calibration using a combined analog signal.

According to an exemplary embodiment, the arrangement of the present disclosure includes superposition means configured to generate a combined analog signal by superimposing the analog reference voltage onto the analog voltage input signal, and converting means configured to convert the combined analog signal into a one-bit serial data stream. The exemplary arrangement also includes decomposition means, which include a first digital filter configured to generate from the one-bit serial data stream a first digital signal at a first data rate, which is less than the conversion sampling rate, first data processing means configured to calculate from the first digital signal a digital input voltage representing the analog voltage input signal, a further digital filter configured to generate from the one-bit serial data stream a further digital signal at a further data rate, which is less than the conversion sampling rate and different from the first data rate, and further data processing means configured to calculate from the further digital signal a digital reference voltage representing the analog reference voltage or a disturbance voltage signal representing parasitic voltage components introduced by the superposition means.

Exemplary embodiments of the present disclosure are based on the concept of combining a one-bit analog to digital conversion with a parallel digital signal processing containing at least two data processing paths, where in each of the paths, the one-bit data stream is subject to digital filtering including digital decimation. Each of the digital decimators generates an individual data rate from one and the same bit stream. The first data processing path extracts from the one-bit data stream the digital representation of the input signal at a first data rate. The further data processing path extracts from the one-bit data stream the digital representation of either the reference voltage or parasitic voltage components at a further data rate. Both signals can be then used by the at least two data processing paths to perform self-calibration. As a result, the arrangement is able to deliver an accurate digital representation of the analog voltage input signal at custom data rate and custom group delay, depending on the dimensions of the decimator in the first digital filter.

In accordance with an exemplary embodiment of the present disclosure, the further data processing means can be second data processing means, which can be configured to derive from the digital reference voltage a correction value and to transmit the correction value to the first data processing means for correcting the digital input voltage and thereby generating a corrected digital input voltage. The second processing means belong to a second data processing path which uses the digital representation of the reference voltage to calculate the gain error between the voltage signal input and the output of the converting means, and outputs the gain error in form of a correction factor to the first data processing path. There, the extracted input signal is corrected, thereby performing the final step of the self-calibration.

In accordance with an exemplary embodiment, the further data processing means can be third processing means configured to transmit the disturbance voltage signal to the first and the second data processing means, respectively, for eliminating the disturbance voltage signal from the digital input voltage and from the digital reference voltage. Thereby, the accuracy of the correction factor, which is derived from the digital reference voltage, as well as of the corrected digital input voltage is increased even further. The third processing means belong to a third data processing path, which in addition contains the further digital filter in the form of a third digital filter, while in this embodiment the second processing path contains a second digital filter and the second data processing means. The second digital filter is configured to generate from the one-bit serial data stream a second digital signal at a second data rate, which is less than the conversion sampling rate and equal to or different from the first data rate, and the third digital filter is configured to generate from the one-bit serial data stream a third digital signal at a third data rate, which is less than the conversion sampling rate and different from the first and second data rates.

In accordance with an exemplary embodiment, the superposition means contain modulation means for generating a modulated reference voltage from the analog reference voltage, where the superposition means can be configured to superimpose the modulated reference voltage—instead of the analog reference voltage—onto the analog voltage input signal.

In accordance with the aforementioned embodiment, the modulation means can be configured to generate the modulated reference voltage as a periodic signal with a fundamental frequency, and the first processing means include subtraction means configured to perform a mathematic subtraction of the digital reference voltage from the first digital signal at the fundamental frequency. Besides, the subtraction of the digital reference voltage from the first digital signal is performed synchronously with the modulated reference voltage applied to the superposition means.

In accordance with an exemplary embodiment of the present disclosure, the second digital signal can be used for diagnostic purposes as well, so that the arrangement is able to perform self-diagnostics. Three different types of error messages can be generated by corresponding diagnostic means, depending on the specific kind of abnormal behavior of the second digital signal. The three diagnostic means can all be part of the decomposition means. In case the amplitude of the second digital signal decreases drastically, a first error message is generated by first diagnostic means, where the first error message indicates that the voltage sensor input is not connected to any external device, for example, that no sensor is connected. In such a case, the input impedance seen by the arrangement becomes high, which leads to the drastic decrease in the second digital signal.

A second error message is generated by second diagnostic means in case the amplitude of the second digital signal remains at a predefined saturation level longer than a predefined first period of time. This second error message indicates that the arrangement has gone into saturation. This can, for example, happen if the ground connection of a sensor casing is lost, in which case the signal is constantly equal to the input saturation level of the arrangement.

Third diagnostic means can be configured to generate a third error message in case a modulated, periodic analog reference voltage is used and the amplitude of the second digital signal alternately remains at a positive and negative saturation level longer than a predefined second period of time. The third error message indicates that the second digital signal is out of range.

Figure 2:
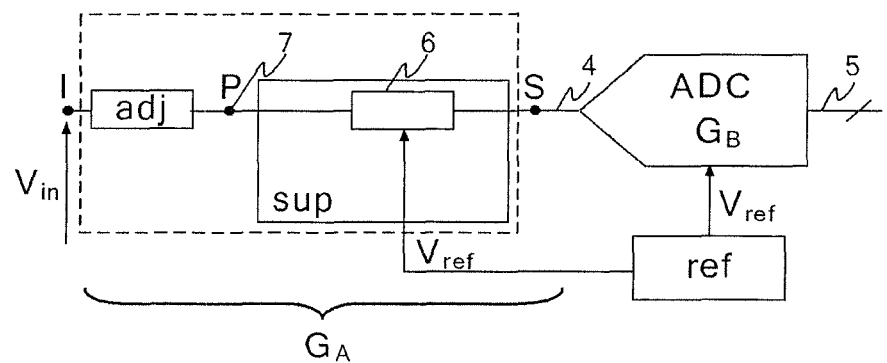
FIG. 2 is a schematic diagram of a readout electronics circuit with online self-calibration.

In FIG. 2, a schematic diagram of a readout electronics circuit with online self-calibration is depicted, which is described in detail in PCT/EP2011/001941. The readout electronics represents the analogous part of the arrangement according to the disclosure. The arrangement includes reference means ref as already described with respect to the known readout electronics of FIG. 1, and converting means ADC which can be described in more detail with respect to FIG. 3. In contrast to FIG. 1, where the readout electronics provides for an offline self-calibration functionality due to the input signal being switched over from the analog voltage input signal $V_{in}$ to the reference voltage $V_{ref}$ during calibration, the arrangement of FIG. 2 allows for online self-calibration. This is due to the presence of superposition means sup which can be arranged between a node P and a node S. The superposition means sup can be configured to superimpose the reference voltage $V_{ref}$ onto the analog voltage input signal $V_{in}$, where in the example of FIG. 2 additional adjusting means adj can be provided to adjust the level of the analog voltage input signal $V_{in}$ to the specification of the readout electronics. The input signal 7 to the superposition means sup becomes an adjusted analog voltage input signal $V_{in,adj}$. The superposition is performed by an actual superposition element 6. The output signal of the superposition means sup is called combined analog signal 4. The analog voltage input signal $V_{in}$ is applied to the arrangement via a voltage signal input, depicted as node I. The overall gain of the arrangement of FIG. 2 is again $G_A \cdot G_B$, with $G_B$ being the gain of the converting means ADC and $G_A$ being the gain of all elements between the voltage signal input, node I, and the input of the converting means ADC, which is the node S in FIG. 2. The output signal 5 of the converting means ADC can be expressed as the following sum:

signal $$5 = G_A \cdot G_B \cdot \frac{V_{ref}}{V_{ref}} + G_A \cdot G_B \cdot \frac{V_{in,adj}}{V_{ref}},$$

with the reference voltage $V_{ref}$ in the denominator being the input signal to the ADC.

Figure 3:
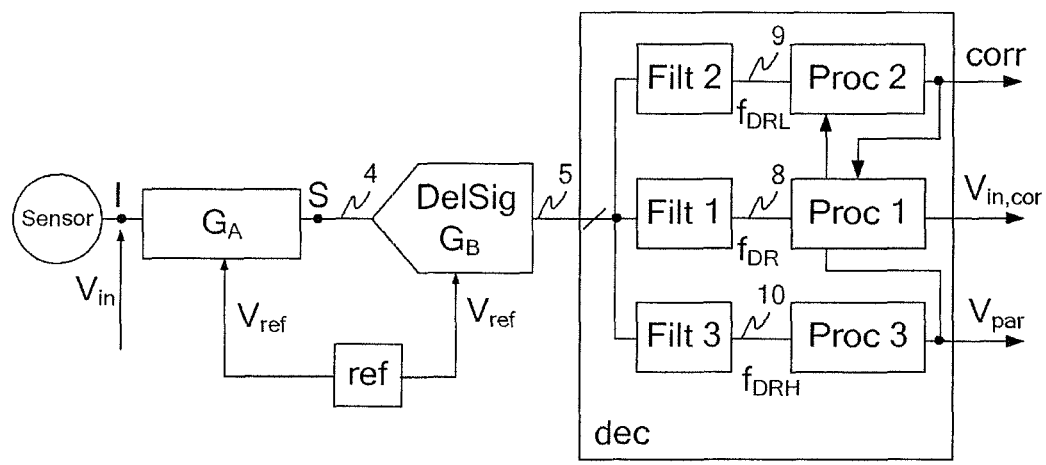
FIG. 3 illustrates an exemplary embodiment of the present disclosure.
Figure 5:
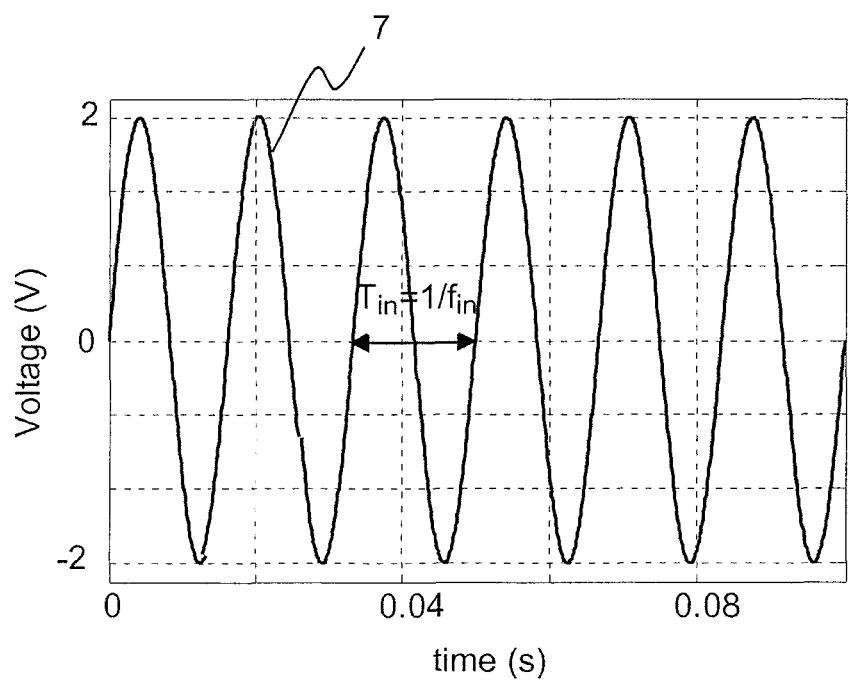
FIG. 5 shows time characteristics of an exemplary analog voltage input signal according to an exemplary embodiment of the present disclosure.
Figure 6:
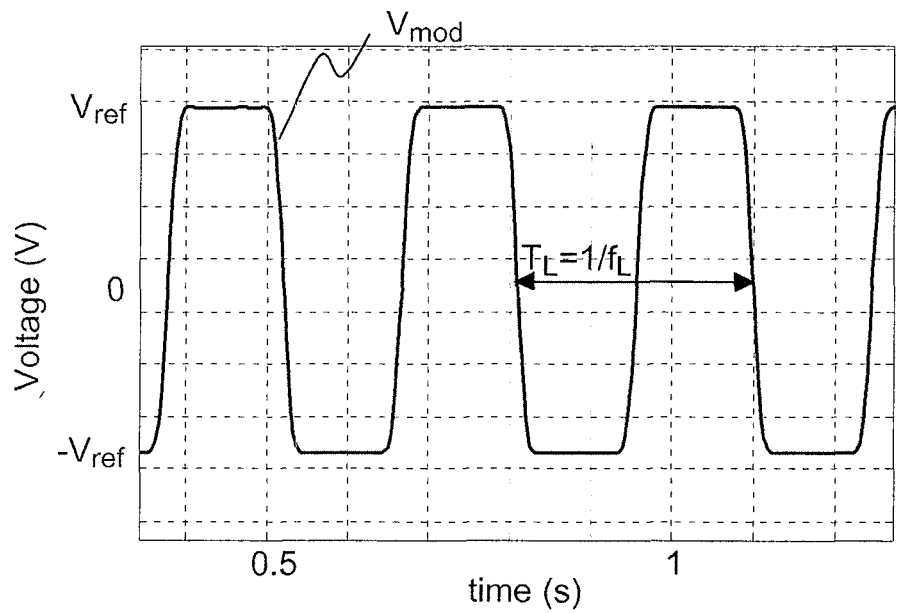
FIG. 6 shows time characteristics of an exemplary modulated reference voltage according to an exemplary embodiment of the present disclosure.

In FIG. 3, the analog part of the arrangement, shown in FIG. 2, is complemented by a digital processing part, depicted as decomposition means dec. Signal 5 is input to the decomposition means dec in order to be digitally separated into the two parts of the above sum. This is done in the following way. The ADC is a delta-sigma modulator which generates signal 5 in the form of a one-bit serial data stream and at a conversion sample rate $f_{cnv}$. Accordingly, signal 5 is a high-speed low-resolution signal. Signal 5 is input to a first filter and a second digital filter, Filt 1 and Filt 2, respectively, which generate from the one-bit serial data stream a first digital signal 8 at a first data rate $f_{DR}$, and a second digital signal 9 at a second data rate $f_{DR}$, respectively, where both data rates can be less than the conversion sampling rate $f_{cnv}$ and can be equal to or differ from each other. Therefore, the first and the second digital signals 8 and 9 can be low-speed high-resolution signals, in comparison to signal 5. From the first digital signal 8, a digital input voltage $V_{in,unc}$ is calculated by first data processing means Proc1 (e.g., a digital processor), where the digital input voltage $V_{in,unc}$ represents the analog voltage input signal $V_{in}$ and is not yet gain error corrected. Second data processing means Proc2 (e.g., a digital processor) can be configured to calculate from the second digital signal 9 a digital reference voltage $V_{ref,dig}$ which represents the analog reference voltage $V_{ref}$. Afterwards, the second data processing means Proc2 derive from a comparison of the digital reference voltage $V_{ref,dig}$ with a theoretically expected reference voltage $V_{ref,th}$ a correction value corr which corresponds to the gain error of the arrangement between voltage signal input I and the output of the delta-sigma modulator. The correction value corr is transmitted to the first data processing means Proc1, where it is used for correcting the digital input voltage $V_{in,unc}$, resulting in a corrected digital input voltage $V_{in,cal}$ The first and second data rates, $f_{DR}$ and $f_{DRL}$, can be chosen in dependence on the frequencies of the voltage input signal $V_{in}$ and the reference voltage $V_{ref}$, as well as on application specific or customer defined requirements. From the exemplary time characteristics shown in FIGS. 5 and 6, possible frequencies of the voltage signals become apparent. FIGS. 5 and 6 will be explained hereafter in connection with FIGS. 8 and 9.

Figure 8:
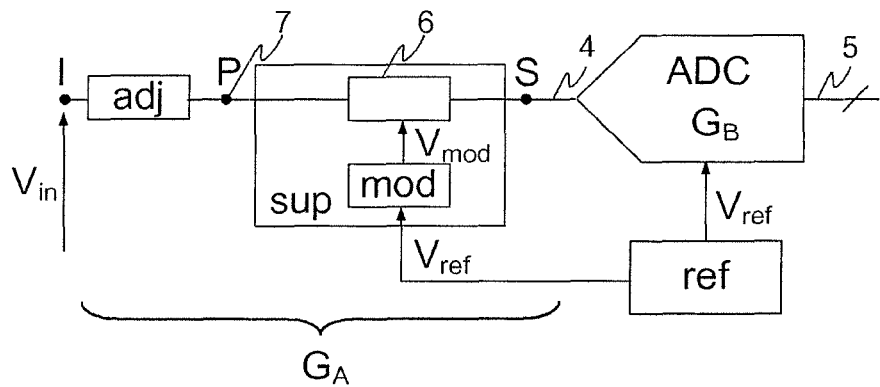
FIG. 8 illustrates a further development of the readout electronics of FIG. 2, according to an exemplary embodiment of the present disclosure.
Figure 9:
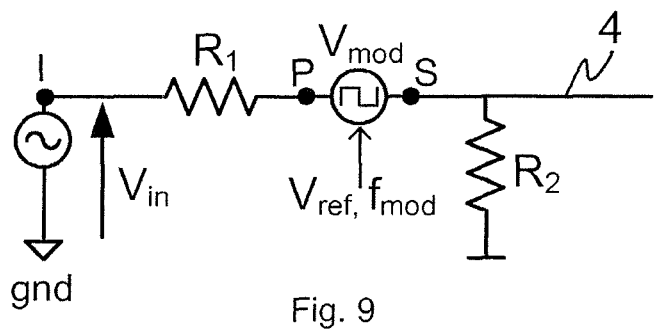
FIG. 9 shows an exemplary implementation of the superposition means of FIG. 8.

In a development of the readout electronics of FIG. 2, shown in FIG. 8, superposition means sup additionally contain modulation means mod to generate a modulated reference voltage $V_{mod}$ from the analog reference voltage $V_{ref}$. In an exemplary implementation of the readout electronics of FIG. 8, shown in FIG. 9, the superposition means sup between nodes P and S can be depicted as a voltage source which delivers the modulated reference voltage $V_{mod}$ in the form of a square wave voltage signal and which is arranged in the current path of the analog voltage input signal $V_{in}$. Adjusting means, which can be implemented as a resistive voltage divider including resistor $R_1$ between nodes I and P and resistor $R_2$ between node S and a reference potential, is intended to decrease the voltage level of the analog voltage input signal $V_{in}$ to a level suitable to the supply voltage level of the electronics. For example, if the analog voltage input signal $V_{in}$ is the output signal of a Rogowski coil with a voltage level of up to 400 V and the voltage supply of the electronics has a level of 5V, the voltage divider can be designed to divide this signal by eighty.

The time characteristics of FIG. 5 shows an exemplary analog voltage input signal $V_{in}$. Due to the adjusting means adj, the AC analog voltage input signal $V_{in}$, delivered, for example, by the above mentioned Rogoswki coil, is reduced by the factor 100, resulting in the reduced analog voltage input signal $V_{in,adj}$ actually depicted in FIG. 5. This is the signal 7 which is applied to node P in FIG. 8. Signal 7 has a frequency $f_{in}$ of approximately 60 Hz. An appropriate first data rate $f_{DR}$ for this frequency would be larger than 120 Hz. The reference voltage shown in FIG. 6 is a modulated, periodic reference voltage $V_{mod}$ generated by the modulation means mod from a DC analog reference voltage $V_{ref}$ of 5V amplitude and with a modulation frequency $f_L$ of about 7 Hz. For these exemplary signals, the first data rate $f_{DR}$ belonging to the calculation of the digital input voltage $V_{in,unc}$ can be chosen to be higher than the second data rate $f_{DRL}$ belonging to the calculation of the digital reference voltage $V_{ref,dig}$.

Figure 4:
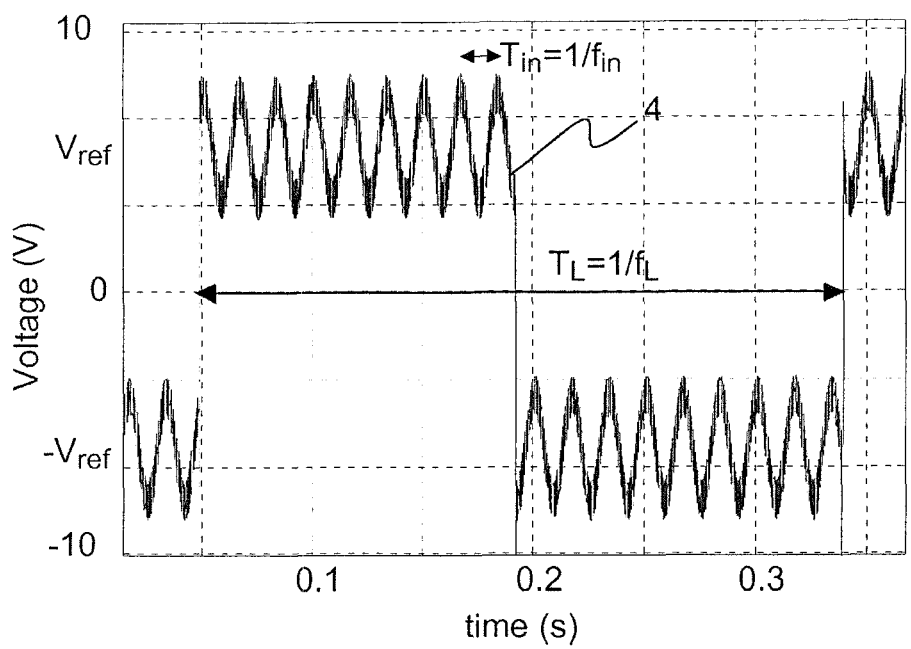
FIG. 4 shows time characteristics of an exemplary output signal of the superposition means according to an exemplary embodiment of the present disclosure.
Figure 7:
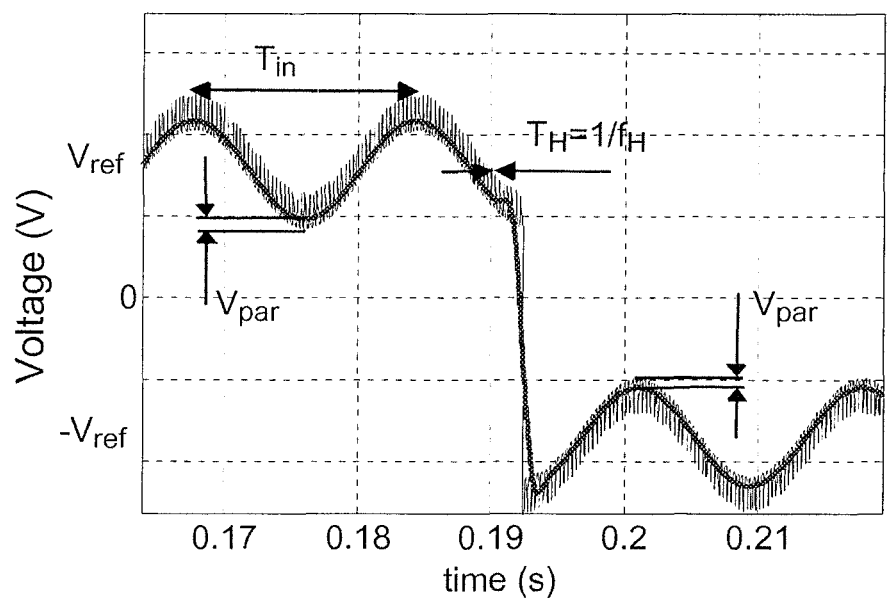
FIG. 7 shows time characteristics of the combined signal of FIGS. 5 and 6, including parasitic voltage components, according to an exemplary embodiment of the present disclosure.

The combined analog signal 4, shown in FIGS. 4 and 7, is the direct result of the superposition of the two signals of FIGS. 5 and 6, using a particular superposition switching scheme as described in PCT/EP2011/001941. Due to the switching at switching frequency $f_H$, parasitic voltage components in the form of spikes can be introduced, which can be clearly visible in FIG. 7, which shows a zoomed-in part of FIG. 4. The spikes define the disturbance voltage signal $V_{par}$.

In order to be able to eliminate the disturbance voltage signal $V_{par}$, it is calculated by using a third digital filter Filt3 (see FIG. 3) which is configured to generate from the one-bit serial data stream 5 a third digital signal 10 at a third data rate $f_{DRH}$. The third data rate $f_{DRH}$ is less than the conversion sampling rate $f_{cnv}$ and is different from the first and second data rates $f_{DR}$, $f_{DRL}$. Accordingly, the third digital signal 10 also becomes a low-speed high-resolution signal, as compared to signal 5. In the above-described example of FIGS. 4 to 9, the third data rate $f_{DRH}$ would be chosen to be higher than the first and second data rates. From the third digital signal 10, the disturbance voltage signal $V_{par}$ is then calculated by third data processing means Proc3 (e.g., a digital processor). The third data processing means Proc3 can be further configured to transmit the disturbance voltage signal $V_{par}$ to the first and the second data processing means, Proc1 and Proc2, respectively, where it is used to eliminate the disturbance voltage signal from the digital input voltage $V_{in,unc}$ and from the digital reference voltage $V_{ref,dig}$.

Figure 10:
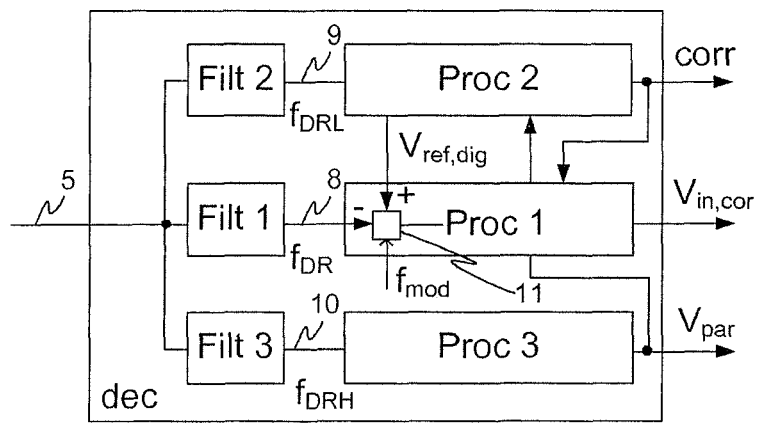
FIG. 10 illustrates a further development of the embodiment of FIG. 3, according to an exemplary embodiment of the present disclosure.

As the one-bit serial data stream, signal 5, contains information of both $V_{in}$ and $V_{ref}$, the first data processing means Proc1 can be configured to remove the reference voltage information in order to generate the digital representation of $V_{in}$. In the case where the reference voltage is a modulated reference voltage in the form of a periodic signal with a fundamental frequency $f_{mod}$, an exemplary embodiment of the present disclosure provides that the first processing means Proc1 includes subtraction means 11 configured to perform a mathematic subtraction of the digital reference voltage $V_{ref,dig}$ from the first digital signal 8 at the fundamental frequency $f_{mod}$ and synchronously with the modulated reference voltage $V_{mod}$, as shown in FIG. 10.

Figure 11:
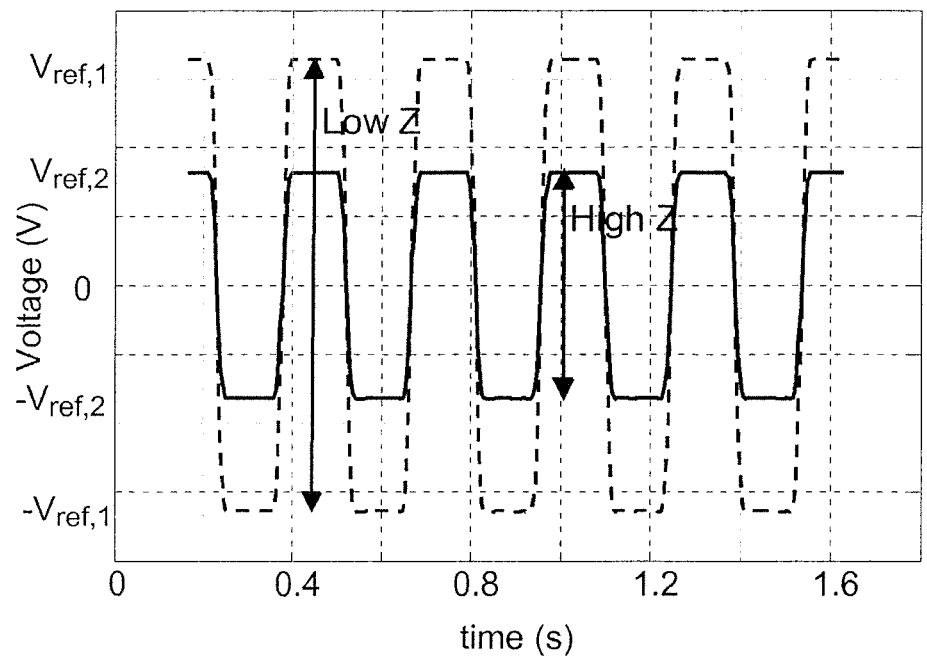
FIG. 11 shows the time characteristics of FIG. 6 with and without an input connection error, according to an exemplary embodiment of the present disclosure.
Figure 14:
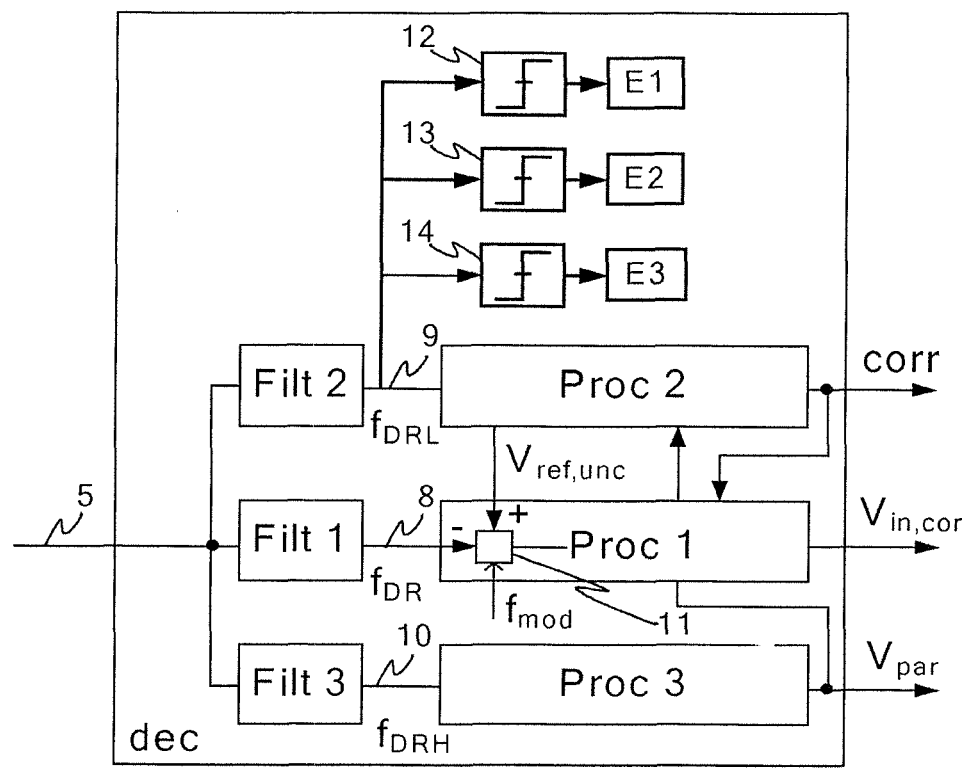
FIG. 14 illustrates the embodiment of FIG. 10 including diagnostic means, according to an exemplary embodiment of the present disclosure.

In addition to the above-described online self-calibration function, according to an exemplary embodiment, the decomposition means dec can additionally include first diagnostic means 12 configured to generate a first error message E1 in case the amplitude of the second digital signal 9 decreases drastically, as shown in FIG. 14. The first error message E1 is generated if the signal source to voltage signal input I, such as a sensor or a rated signal source, is disconnected. If this happens, the input impedance Z seen by the arrangement becomes high, resulting in a drastic decrease of the modulated reference voltage $V_{mod}$, as depicted in FIG. 11.

Figure 12:
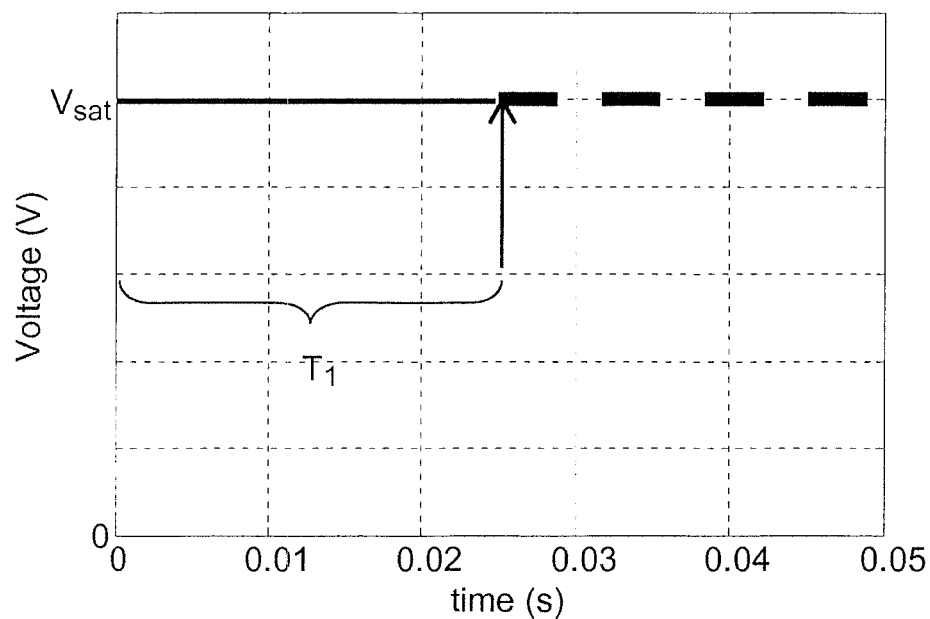
FIG. 12 shows the time characteristics of FIG. 6 in case the arrangement has gone into saturation, according to an exemplary embodiment of the present disclosure.

Second diagnostic means 13 can be configured to generate a second error message E2 in case the amplitude of the second digital signal 9 remains at a predefined saturation level $V_{sat}$ longer than a predefined first period of time $T_1$. This situation is illustrated in FIG. 12. A long saturation period of the input of the readout electronics can occur when the ground connection of the casing of a voltage sensor, for example a resistive divider, currently connected to voltage signal input I is lost.

In FIG. 14, third diagnostic means 14 can be shown which can be configured to generate a third error message E3 in case the amplitude of the second digital signal 9 alternately remains at a higher and lower saturation level, $V_{sat,H}$ and $V_{sat,L}$, and each time longer than a predefined second period of time $T_2$.

Figure 13:
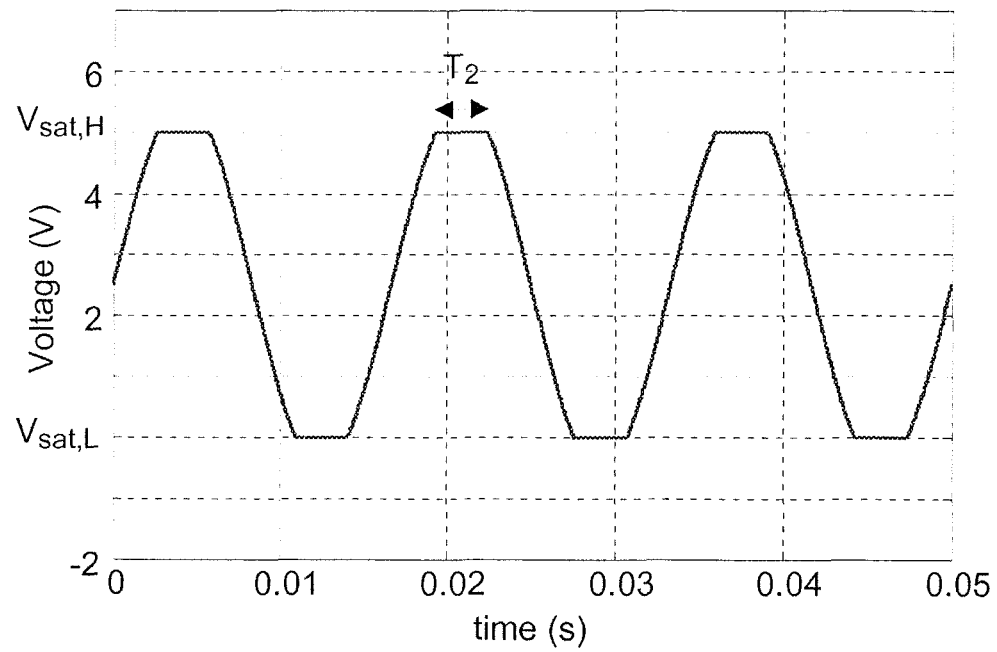
FIG. 13 shows the time characteristics of FIG. 6 in case that the modulated reference voltage is out of range, according to an exemplary embodiment of the present disclosure.

The third error message E3 indicates that the combined analog signal 4 is out of range, due to an out-of-range analog voltage input signal $V_{in}$, as illustrated by FIG. 13.

It will be appreciated by those skilled in the art that the present invention can be embodied in other specific forms without departing from the spirit or essential characteristics thereof. The presently disclosed embodiments can be therefore considered in all respects to be illustrative and not restricted. The scope of the invention is indicated by the appended claims rather than the foregoing description and all changes that come within the meaning and range and equivalence thereof can be intended to be embraced therein.

What is claimed is:

1. An arrangement for reading out an analog voltage input signal, the arrangement comprising:
    a voltage signal input for applying the analog voltage input signal thereto;
    reference means for generating an analog reference voltage;
    superposition means for generating a combined analog signal by superimposing the analog reference voltage onto the analog voltage input signal;
    converting means for converting the combined analog signal into a one-bit serial data stream at a conversion sampling rate; and
    decomposition means, the decomposition means including:
        a first digital filter configured to generate from the one-bit serial data stream a first digital signal at a first data rate, which is less than the conversion sampling rate;
        first data processing means for calculating from the first digital signal a digital input voltage representing the analog voltage input signal;
        a further digital filter configured to generate from the one-bit serial data stream a further digital signal at a further data rate, which is less than the conversion sampling rate and different from the first data rate; and further data processing means for calculating from the further digital signal one of a digital reference voltage representing the analog reference voltage and a disturbance voltage signal representing parasitic voltage components introduced by the superposition means.

2. The arrangement according to claim 1, wherein the further data processing means is a second data processing means configured to derive a correction value from the digital reference voltage, and to transmit the correction value to the first data processing means for correcting the digital input voltage and thereby generating a corrected digital input voltage.

3. The arrangement according to claim 2, wherein the further data processing means is a third data processing means configured to transmit the disturbance voltage signal to the first data processing means and the second data processing means, respectively, for eliminating the disturbance voltage signal from the digital input voltage and from the digital reference voltage.

4. The arrangement according to claim 3, wherein the superposition means include modulation means for generating a modulated reference voltage from the analog reference voltage, and the superposition means superimposes the modulated reference voltage onto the analog voltage input signal.

5. The arrangement according to claim 4, wherein:
the modulation means is configured to generate the modulated reference voltage as a periodic signal with a fundamental frequency; and
the first data processing means include subtraction means configured to perform a mathematic subtraction of the digital reference voltage from the first digital signal at the fundamental frequency and synchronously with the modulated reference voltage.

6. The arrangement according to claim 4, wherein the decomposition means includes first diagnostic means for generating a first error message in case an amplitude of the second digital signal decreases drastically.

7. The arrangement according to claim 4, wherein the decomposition means include second diagnostic means for generating a second error message in case an amplitude of the second digital signal remains at a predefined saturation level longer than a predefined first period of time.

8. The arrangement according to claim 4, wherein the decomposition means include third diagnostic means for generating a third error message in case an amplitude of the second digital signal alternately remains at higher and lower saturation levels longer than a predefined second period of time.

9. The arrangement according to claim 1, wherein the superposition means include modulation means for generating a modulated reference voltage from the analog reference voltage, and the superposition means superimposes the modulated reference voltage onto the analog voltage input signal.

10. The arrangement according to claim 9, wherein:
the modulation means is configured to generate the modulated reference voltage as a periodic signal with a fundamental frequency; and
the first data processing means include subtraction means configured to perform a mathematic subtraction of the digital reference voltage from the first digital signal at the fundamental frequency and synchronously with the modulated reference voltage.

11. The arrangement according to claim 1, wherein the decomposition means includes first diagnostic means for generating a first error message in case an amplitude of the second digital signal decreases drastically.

12. The arrangement according to claim 11, wherein the decomposition means include second diagnostic means for generating a second error message in case the amplitude of the second digital signal remains at a predefined saturation level longer than a predefined first period of time.

13. The arrangement according to claim 12, wherein the decomposition means include third diagnostic means for generating a third error message in case the amplitude of the second digital signal alternately remains at higher and lower saturation levels longer than a predefined second period of time.

14. The arrangement according to claim 1, wherein the decomposition means include second diagnostic means for generating a second error message in case an amplitude of the second digital signal remains at a predefined saturation level longer than a predefined first period of time.

15. The arrangement according to claim 1, wherein the decomposition means include third diagnostic means for generating a third error message in case an amplitude of the second digital signal alternately remains at higher and lower saturation levels longer than a predefined second period of time.

* * * * *